United States Patent
Lozhkin

(10) Patent No.: US 8,385,852 B2
(45) Date of Patent: Feb. 26, 2013

(54) PHASE CORRECTION APPARATUS AND PHASE CORRECTION METHOD

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 407 days.

(21) Appl. No.: 12/814,786

(22) Filed: Jun. 14, 2010

(65) Prior Publication Data

US 2010/0323639 A1 Dec. 23, 2010

(30) Foreign Application Priority Data

Jun. 17, 2009 (JP) ................. 2009-144356

(51) Int. Cl.
*H04B 1/04* (2006.01)
*H04L 25/03* (2006.01)

(52) U.S. Cl. .................. 455/114.3; 455/115.1; 455/126; 375/296

(58) Field of Classification Search ............... 455/114.2, 455/114.3, 115.1, 126; 375/296
See application file for complete search history.

(56) References Cited

U.S. PATENT DOCUMENTS

| | | | | |
|---|---|---|---|---|
| 5,802,451 A * | 9/1998 | Adachi et al. | ................. | 455/126 |
| 5,894,496 A * | 4/1999 | Jones | ........................... | 455/126 |
| 6,639,950 B1 * | 10/2003 | Lagerblom et al. | ........... | 375/297 |
| 7,177,366 B1 * | 2/2007 | Dawson et al. | ............... | 375/295 |
| 7,433,420 B1 * | 10/2008 | Dakshinamurthy et al. | .. | 375/296 |
| 7,689,180 B2 * | 3/2010 | Grundlingh et al. | .......... | 455/126 |
| 2010/0323638 A1 * | 12/2010 | Lozhkin | ........................ | 455/113 |
| 2010/0323640 A1 * | 12/2010 | Lozhkin | ........................ | 455/113 |

FOREIGN PATENT DOCUMENTS

JP 9-64932 3/1997

OTHER PUBLICATIONS

Joel L. Dawson, et al. "Automatic Phase Alignment for a Fully Integrated CMOS Cartesian Feedback Power Amplifier System" IEEE International Solid-State Circuits Conference, Jan. 2, 2003.
Joel L. Dawson, et al. "Automatic Phase Alignment for a Fully Integrated Cartesian Feedback Power Amplifier System" IEEE Journal of Solid-State Circuits, vol. 38, No. 12, Dec. 2003.

* cited by examiner

*Primary Examiner* — Duc M Nguyen
(74) *Attorney, Agent, or Firm* — Katten Muchin Rosenman LLP

(57) ABSTRACT

A phase correction apparatus in a wireless transmitter includes a modulator for modulating a first carrier signal by an in-phase component and a quadrature-phase component of a first signal, a demodulator for demodulating a returned signal by a second carrier signal and generating a second signal including an in-phase component and an quadrature-phase component, a phase detector for detecting a phase error between the first signal and the second signal based on the in-phase components and the quadrature-phase components of the first and second signals, and a phase shifter group for performing a phase shift based on the phase error, the phase shifter group including a first phase shifter for performing a phase shift on any of the first signal, the second signal, the first carrier signal, and the second carrier signal and a second phase shifter for shifting a phase of the first signal.

10 Claims, 9 Drawing Sheets

FIG.6

| SIGN OF Q* | SIGN OF I | SIGN OF I* | SIGN OF Q | SIGN OF sin(ΔΦ) |
|---|---|---|---|---|
| − | − | − | − | INDEFINITE |
| − | − | − | + | + |
| − | − | + | − | + |
| − | + | + | + | INDEFINITE |
| − | + | − | − | − |
| − | + | + | + | INDEFINITE |
| − | + | + | − | INDEFINITE |
| + | − | − | + | − |
| + | − | + | − | − |
| + | − | + | + | INDEFINITE |
| + | + | − | − | INDEFINITE |
| + | + | − | + | − |
| + | + | + | − | + |
| + | + | + | + | INDEFINITE |

FIG.8

| OUTPUT OF COMPARATOR 51-1 | OUTPUT OF COMPARATOR 51-2 | OUTPUT OF COMPARATOR 51-3 | OUTPUT OF COMPARATOR 51-4 | SIGN OF sin(ΔΦ) | ROM ADDRESS | VALUE D₀ OF ROM FOR sin(ΔΦ) (SU) | VALUE D₁ OF ROM FOR sin(ΔΦ) (SD) |
|---|---|---|---|---|---|---|---|
| 0 | 0 | 0 | 0 | INDEFINITE | 0 | X | X |
| 0 | 0 | 0 | 1 | + | 1 | 1 | 0 |
| 0 | 0 | 1 | 0 | + | 2 | 1 | 0 |
| 0 | 0 | 1 | 1 | INDEFINITE | 3 | X | X |
| 0 | 1 | 0 | 0 | − | 4 | 0 | 1 |
| 0 | 1 | 0 | 1 | INDEFINITE | 5 | X | X |
| 0 | 1 | 1 | 0 | INDEFINITE | 6 | X | X |
| 0 | 1 | 1 | 1 | − | 7 | 0 | 1 |
| 1 | 0 | 0 | 0 | − | 8 | 0 | 1 |
| 1 | 0 | 0 | 1 | INDEFINITE | 9 | X | X |
| 1 | 0 | 1 | 0 | INDEFINITE | 10 | X | X |
| 1 | 0 | 1 | 1 | − | 11 | 0 | 1 |
| 1 | 1 | 0 | 0 | INDEFINITE | 12 | X | X |
| 1 | 1 | 0 | 1 | + | 13 | 1 | 0 |
| 1 | 1 | 1 | 0 | + | 14 | 1 | 0 |
| 1 | 1 | 1 | 1 | INDEFINITE | 15 | X | X |

FIG.9

| INPUT | | OUTPUT (CONTROL VOLTAGE) |
|---|---|---|
| SU | SD | |
| 1 | 0 | INCREASE |
| 0 | 1 | DECREASE |
| X | X | HOLD |

PHASE CORRECTION APPARATUS AND PHASE CORRECTION METHOD

CROSS-REFERENCE TO RELATED APPLICATION

This application is based upon and claims the benefit of priority of the prior Japanese Patent Application No. 2009-144356, filed on Jun. 17, 2009, the entire contents of which are incorporated herein by reference.

FIELD

Embodiments of the present invention relate to a phase correction technology used for a wireless transmitter.

BACKGROUND

An output signal from a power amplifier for wireless transmission generally has a limitation on linearity, and in particular, a gain is decreased when a level of an input signal is large (linearity distortion). As a circuit for compensating such a linearity distortion, a Cartesian feedback type distortion correction apparatus is known. If the Cartesian feedback type distortion correction apparatus functions ideally, a high linearity may be obtained in the output signal from the power amplifier.

In the Cartesian feedback type distortion correction apparatus, the output signal from the power amplifier is taken out and fed back to an input side. At this time, for example, a phase change in a feed back system is generated along with an influence of an antenna load, a propagation delay of a directional coupler or a demodulator, or the like. Therefore, in order to effectively operate the Cartesian feedback type distortion correction apparatus, it is necessary to correct this phase change in the feed back system.

From the above-mentioned viewpoint, a phase correction apparatus applied to the Cartesian feedback type distortion correction apparatus is known. FIG. 1 illustrates a main part of this phase correction apparatus.

In FIG. 1, an in-phase component I and a quadrature-phase component Q of a baseband signal for transmission are combined after being modulated by a quadrature-phase modulator 40. This combined signal is amplified by a power amplifier 90 (PA) to a desired level and transmitted as an RF signal (RF_OUT). Also, a part of this RF signal (RF_OUT) is taken out (feed back) by a directional coupler, and a baseband signal (an in-phase component I*, a quadrature-phase component Q*) is generated by a quadrature-phase demodulator 30 from a feedback signal y(t). Herein, based on the above-mentioned phase change in the feed back system (in FIG. 1, a delay equivalent to the phase change is denoted as delay period τ), I≠I* and Q≠Q* are established, and in order to correct this phase change, a phase correction apparatus is provided.

In FIG. 1, the phase correction apparatus is provided with a phase detector including a sine detection unit 101 and a cosine detection unit 102, and a phase shifter 104. Herein, when a target correction amount of the phase (that is, a phase error) is set as $\Delta\phi$, the fed-back baseband signal (the in-phase component I*, the quadrature-phase component Q*) is represented as in the following Expression (1) and Expression (2). In Expression (1) and Expression (2), only when $\Delta\phi=0$, I=I* and Q=Q* are established. Also, $\sin(\Delta\phi)$ is calculated by the sine detection unit 101 based on the following Expression (3). In Expression (3), k denotes a normalized constant, and $k=1/(I\cdot I+Q\cdot Q)$.

$$I^* = I\cdot\cos(\Delta\phi) + Q\cdot\sin(-\Delta\phi) \quad (1)$$

$$Q^* = I\cdot\sin(\Delta\phi) + Q\cdot\cos(\Delta\phi) \quad (2)$$

$$\sin(\Delta\phi) = k\cdot(I\cdot Q^* - Q\cdot I^*) \quad (3)$$

Also, the cosine detection unit 102 calculates $\cos(\Delta\phi)$ while following a relation of $\cos(\Delta\phi)=(1-\sin^2(\Delta\phi))^{1/2}$. In the cosine detection unit 102, a configuration is adopted in which a square sum of the input to the phase shifter 104 becomes a given constant Mag, and with this configuration, the compensation is made so that the amplitude of the output signal from the phase shifter 104 is constant.

As illustrated in the following Expression (4), the phase shifter 104 respectively multiplies a carrier signal $\sin(\omega t)$ from a local oscillator and a signal obtained by shifting the carrier signal by $\pi/2$ by $\cos(\Delta\phi)$ and $\sin(\Delta\phi)$ to be combined. As a result, a signal $\sin(\omega t+\Delta\phi)$ in which the phase is advanced by $\Delta\phi$ with respect to the carrier signal $\sin(\omega t)$ from the local oscillator is supplied to the quadrature-phase modulator 40. Therefore, the phase error between the RF signal y(t) fed back from the output of the wireless transmitter and the carrier signal provided to the quadrature-phase modulator 40 becomes 0 ($\Delta\phi=0$).

$$\cos(\Delta\phi)\cdot\sin(\omega t) + \sin(\Delta\phi)\cdot\cos(\omega t) = \sin(\omega\cdot t + \Delta\phi) \quad (4)$$

Herein, the phase correction apparatus described with reference to FIG. 1 may basically perform the correction when the phase error $\Delta\phi$ is in a range of $-\pi/2<\Delta\phi<+\pi/2$. In view of the above, a phase correction apparatus is desired which may perform the correction in a range of the entire phase range, that is, $-\pi<\Delta\phi<+\pi$.

As the phase correction apparatus which may perform the correction in the range of the entire phase range, an apparatus which is provided with a phase shifter for shifting the phase of the fed-back baseband signal in $\pi/2$ unit is known. Hereinafter, a description will be given of this phase correction apparatus with reference to FIG. 2.

In FIG. 2, the phase shifter 104 may perform the correction in a range of $-\pi/2<\Delta\phi<+\pi/2$. Also, the phase shifter 104 is provided with a $\pi/2$ phase shifter 108 capable of shifting the fed-back baseband signal (the in-phase component I*, the quadrature-phase component Q*) from the quadrature-phase demodulator 30 in the $\pi/2$ unit. The phase detector 103 detects the phase error (the target correction amount) from the baseband signal for transmission (the in-phase component I, the quadrature-phase component Q) and the fed-back baseband signal (the in-phase component I*, the quadrature-phase component Q*). Then, in a case where the target correction amount exceeds the range of $-\pi/2<\Delta\phi<+\pi/2$, the phase detector 103 sends out a signal for shifting the phase of the fed-back baseband signal (the in-phase component I*, the quadrature-phase component Q*) in the $\pi/2$ unit to the $\pi/2$ phase shifter 108.

Incidentally, in the phase correction apparatus illustrated in FIG. 2, a transfer function H(s) of the control system (s: Laplace operator) is as illustrated in Expression (5). In Expression (5), the setting is as follows.

K(s): A transfer function on a direct line between the input and output of the system α(s): A transfer function of the π/2 phase shifter 108
β(s): A transfer function on a feed back line except for the π/2 phase shifter 108

$$H(s) = \frac{K(s)}{1 + \beta(s) \cdot \alpha(s) \cdot K(s)} \approx \frac{1}{\beta(s) \cdot \alpha(s)} \quad (5)$$

Expression (5) means that the transfer function H(s) of the control system depends on the transfer functions α(s) and β(s) on the feed back line. Therefore, in the phase correction apparatus illustrated in FIG. 2, a characteristic of the output of the control system (that is, the output of the power amplifier) is easily affected by a non-linearity of the π/2 phase shifter 108 and a distortion characteristic. This situation is not preferable in terms of a stable function of the phase correction operation.

SUMMARY

According to an aspect of the embodiments discussed herein, a phase correction apparatus in a wireless transmitter for converting a first signal into a wireless signal and amplifying the wireless signal by a power amplifier, the phase correction apparatus includes a quadrature-phase modulator for modulating a first carrier signal by an in-phase component and a quadrature-phase component of the first signal, a quadrature-phase demodulator for demodulating a returned signal returned from an output of the power amplifier by a second carrier signal and generating a second signal including an in-phase component and an quadrature-phase component, a phase detector for detecting a phase error between the first signal and the second signal based on the in-phase components and the quadrature-phase components of the first signal and the second signal, and a phase shifter group for performing a phase shift based on the phase error, the phase shifter group including a first phase shifter for performing a phase shift on any of the first signal, the second signal, the first carrier signal, and the second carrier signal and a second phase shifter for shifting a phase of the first signal.

It is to be understood that both the foregoing general description and the following detailed description are exemplary and explanatory and are not restrictive of the embodiments, as claimed.

BRIEF DESCRIPTION OF DRAWINGS

FIG. 6 illustrates a relation between signs of respective components of a baseband signal for transmission and a baseband signal to be fed back and signs of a sine value of a phase error according to a second embodiment;

FIG. 8 illustrates a setting example of a ROM in the phase detector according to the second embodiment; and FIG. 9 illustrates an input and output relation of an integrator in the phase detector according to the second embodiment.

DESCRIPTION OF EMBODIMENTS

First Embodiment

Hereinafter, a wireless transmitter provided with a Cartesian feedback type distortion correction apparatus for compensating a linearity distortion of a power amplifier will be described. For this Cartesian feedback type distortion correction apparatus, a phase correction apparatus is applied.

(1-1) Overall Configuration of the Wireless Transmitter

Hereinafter, an overall configuration of the wireless transmitter according to the first embodiment will be described with reference to FIG. 3.

Figure 1:
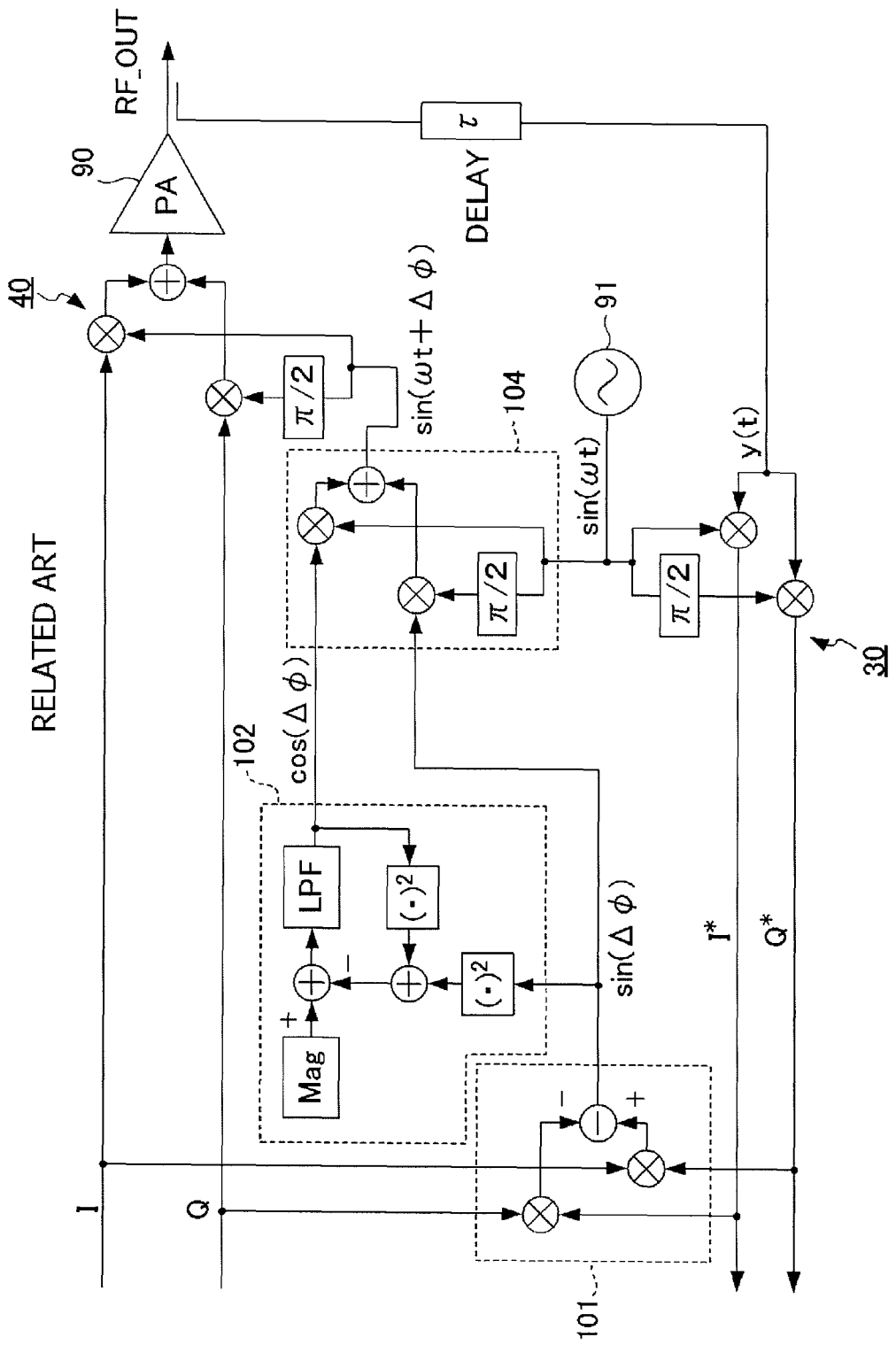
FIG. 1 is a block diagram illustrating an example of a related phase correction apparatus.
Figure 2:
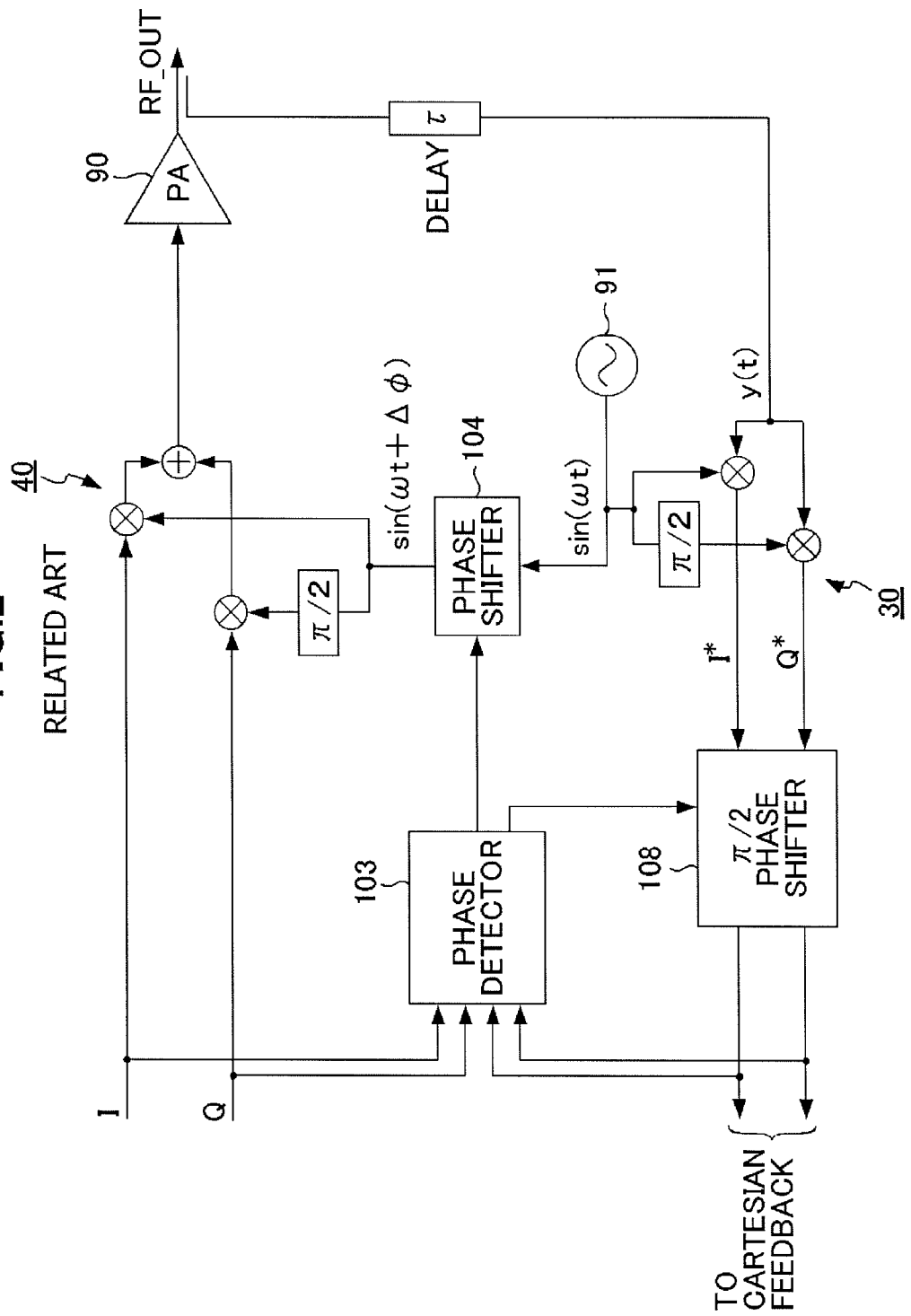
FIG. 2 is a block diagram illustrating another example of the related phase correction apparatus.
Figure 3:
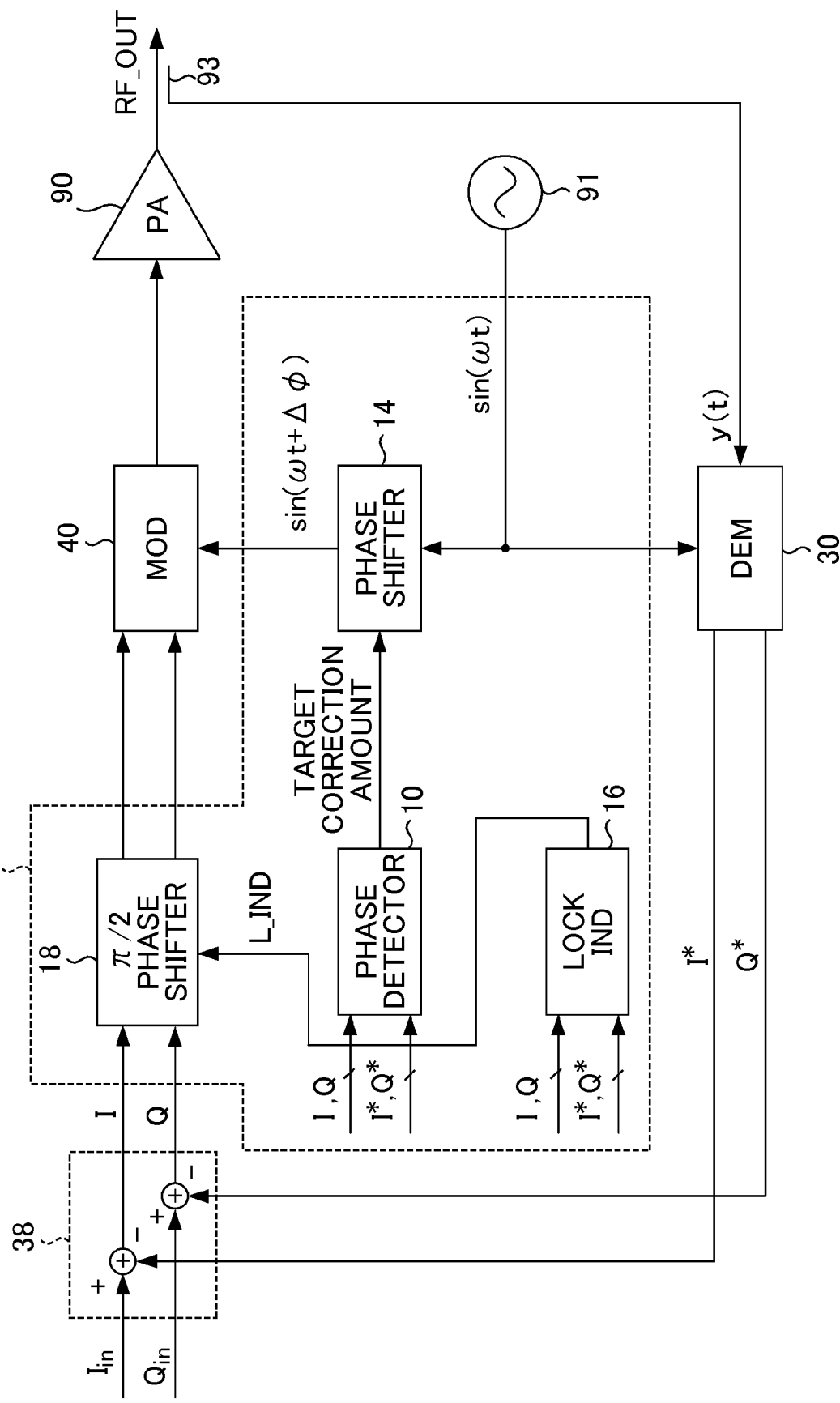
FIG. 3 is a block diagram illustrating an overall configuration of a main part in a wireless transmitter according to the first embodiment.

FIG. 3 is a block diagram illustrating an overall configuration of a main part in the wireless transmitter according to the first embodiment. The wireless transmitter illustrated in FIG. 3 includes a phase detector 10, a phase shifter 14, a lock indicator 16 (LOCK IND), a π/2 phase shifter 18, a quadrature-phase demodulator 30 (DEM), a subtractor 38, a quadrature-phase modulator 40 (MOD), a power amplifier 90 (PA), a local oscillator 91, and a directional coupler 93.

In the wireless transmitter illustrated in FIG. 3, a carrier signal generated by the local oscillator 91 is provided to the quadrature-phase demodulator 30. An RF signal (RF_OUT) output by the power amplifier 90 is taken out by the directional coupler 93, and a baseband signal (an in-phase component I*, a quadrature-phase component Q*) is generated by the quadrature-phase demodulator 30. This baseband signal (the in-phase component I*, the quadrature-phase component Q*) is fed back to the subtractor 38. In the subtractor 38, the baseband signal to be fed back (the in-phase component I*, the quadrature-phase component Q*) is subtracted from the input baseband signal (an in-phase component $I_{in}$, a quadrature-phase component $Q_{in}$). An error signal obtained by the subtractor 38 is directed to the quadrature-phase modulator 40. With this configuration, the Cartesian feedback is formed.

In the description of this embodiment, the baseband signal input to the quadrature-phase modulator 40 is referred to as baseband signal for transmission (an in-phase component I, a quadrature-phase component Q). The baseband signal for transmission is a signal generated when an error signal obtained by the subtractor 38 has been subjected to a given transport element (not illustrated) for the amplification. The baseband signal for transmission (the in-phase component I, the quadrature-phase component Q) and the baseband signal to be fed back (the in-phase component I*, the quadrature-phase component Q*) are input to the phase detector 10 and the lock indicator 16.

The phase detector 10 detects a phase error based on the baseband signal for transmission (the in-phase component I, the quadrature-phase component Q) and the baseband signal to be fed back (the in-phase component I*, the quadrature-phase component Q*) and provides the detected phase error as a target correction amount (target value) to the phase shifter 14. The phase shifter 14 shifts the phase of the carrier signal with respect to the quadrature-phase modulator 40 from the local oscillator 91 by the target correction amount provided from the phase detector 10.

This phase correction apparatus may also be regarded as a PLL (Phase Locked Loop) in an aspect that the phase of the baseband signal for transmission (the in-phase component I, the quadrature-phase component Q) functioning as the input signal and the phase of the fed-back baseband signal (the in-phase component I*, the quadrature-phase component Q*) functioning as the output signal are synchronized. In the following description, the phase correction apparatus according to the first embodiment is appropriately referred to as "PLL" simply in a case where a phase synchronization function thereof is paid attention to.

The lock indicator 16 performs a lock determination of the PLL and outputs a lock determination signal L_IND of a logical level to the π/2 phase shifter 18. In a case where the lock is not effected, that is, the phase error is not corrected, the lock indicator 16 sets the lock determination signal L_IND output to the π/2 phase shifter 18 active. With this configuration, the π/2 phase shifter 18 shifts the phase of the baseband signal for transmission (the in-phase component I, the quadrature-phase component Q) in the π/2 unit.

As described above, in this phase correction apparatus, the phase correction processing is carried out in the phase shifter 14 and the π/2 phase shifter 18. With regard to the phase shifter 14, the phase error Δφ capable of shifting may be within a certain range (for example, $-\pi/2 < \Delta\phi < +\pi/2$). With respect to the large phase error out of the range, the phase error is corrected as the phase shifter 14 operates together with the π/2 phase shifter 18.

As illustrated in FIG. 3, in the phase correction apparatus according to the first embodiment, the π/2 phase shifter 18 is provided between the subtractor 38 and the quadrature-phase modulator 40. That is, in the feed back control system constituting the phase correction apparatus according to the first embodiment, the π/2 phase shifter 18 is arranged on the direct line (direct line between the input and output of the system) instead of the feed back line. This arrangement has an important meaning with regard to an influence on a gain characteristic of the entire system which is caused by a gain characteristic of the π/2 phase shifter 18. That is, according to the first embodiment, as the π/2 phase shifter 18 is arranged on the direct line, and in the above-mentioned Expression (5), the transfer function of the π/2 phase shifter 18 may be equivalent to a part of K(s), but in the case of K(s)>>1 (for example, a case of dealing with a high frequency), K(s) may be ignored in consideration of the transfer function of the entire system.

(1-2) Configuration of the Phase Correction Apparatus

Next, a configuration of the phase correction apparatus will be described with reference to FIG. 4.

Figure 4:
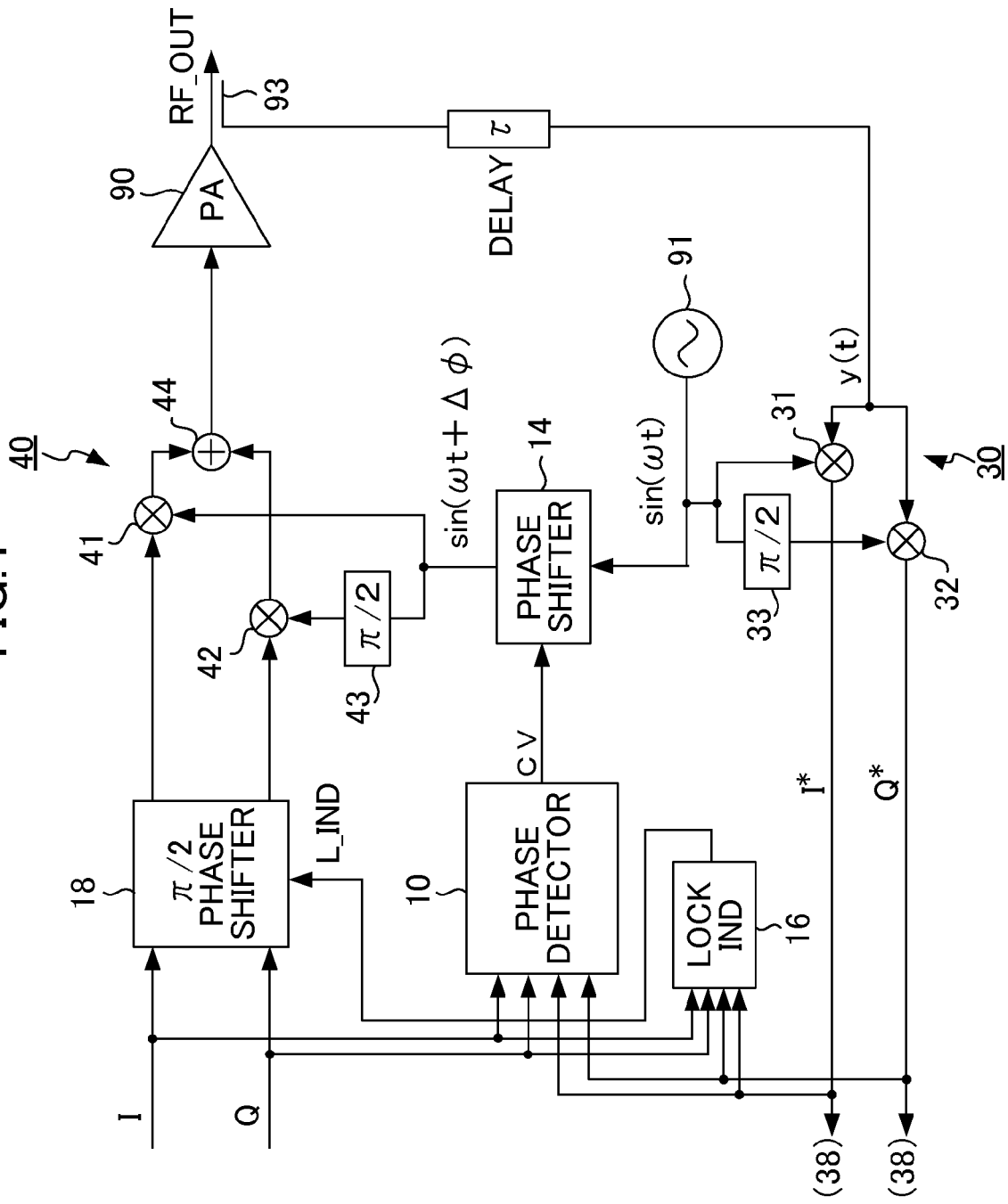
FIG. 4 is a block diagram only illustrating parts related to the phase correction apparatus in the wireless transmitter according to the first embodiment.

FIG. 4 is a block diagram only illustrating parts related to the phase correction apparatus in the wireless transmitter according to the first embodiment. That is, in FIG. 4, as being different from FIG. 3, the entire Cartesian feedback system is not illustrated.

In FIG. 4, a delay element of the RF signal taken out from the directional coupler 93 to be fed back is represented as τ. Also, as illustrated in FIG. 4, the quadrature-phase demodulator 30 is provided with a mixer 31, a mixer 32, and a π/2 phase shifter 33, and the quadrature-phase modulator 40 is provided with a mixer 41, a mixer 42, a π/2 phase shifter 43, and an adder 44.

The mixer 31 multiplies the fed-back RF signal y(t) (returned signal) by the carrier signal sin(ωt) (the second carrier signal) from the local oscillator 91 to generate an in-phase component I* of a baseband signal (second signal). The mixer 32 multiplies the fed-back RF signal y(t) by a signal obtained by shifting the carrier signal sin(ωt) from the local oscillator 91 by π/2 (the second carrier signal) to generate a quadrature-phase component Q* of the baseband signal (the second signal).

The phase of the carrier signal (the first carrier signal) provided to the quadrature-phase modulator 40 is shifted by the phase shifter 14 by Δφ(sin(ωt+Δφ)). The mixer 41 multiplies the in-phase component I of the baseband signal for transmission (the first signal) or the in-phase component I whose phase is shifted by the π/2 phase shifter 18 by a carrier signal sin(ωt+Δφ). The mixer 42 multiplies the quadrature-phase component Q of the baseband signal for transmission (the first signal) or the quadrature-phase component Q whose phase is shifted by the π/2 phase shifter 18 by a signal obtained by shifting the carrier signal sin(ωt+Δφ) by π/2. The adder 44 adds output signals of the mixer 41 and the mixer 42 to be supplied to the power amplifier 90.

On the basis of the signals of the respective component of the baseband signal for transmission (the in-phase component I, the quadrature-phase component Q) and the baseband signal to be fed back (the in-phase component I*, the quadrature-phase component Q*), the phase detector 10 sets a controlled voltage CV (Controlled Voltage) provided to the phase shifter 14. Herein, when the phase error between the baseband signal for transmission and the baseband signal to be fed back is set as Δφ, the controlled voltage CV is a value in accordance with sin(Δφ). The controlled voltage CV in accordance with sin(Δφ) may be obtained, for example, based on the above-mentioned Expression (3).

The phase shifter 14 is a phase shifter for shifting the phase by an amount in accordance with the controlled voltage CV from the phase detector 10. As compared with the π/2 phase shifter 18, the phase shifter 14 may perform the phase shift at a minute amount, but the phase amount at which the shift may be performed is small.

The phase shifter 14 shifts the carrier signal sin(ωt) from the local oscillator 91 by the phase amount based on the controlled voltage CV from the phase detector 10 and generates the carrier signal sin(ωt+Δφ) with respect to the quadrature-phase modulator 40. According to the first embodiment, as long as the phase shifter 14 shifts the phase in accordance with the value of the provided controlled voltage, the configuration is not limited. According to this embodiment, the phase shift is performed only based on the value of sin(Δφ), which is effective when the phase error Δφ is in the range of $-\pi/2 < \Delta\phi < +\pi/2$. When the phase error Δφ is within the range of $-\pi/2 < \Delta\phi < +\pi/2$, sin(Δφ)≈Δφ is assumed, and it suffices if the phase shifter 14 is provided with a configuration for causing a phase shift by an amount in proportion to the controlled voltage CV.

The lock indicator 16 compares the baseband signal for transmission (the in-phase component I, the quadrature-phase component Q) with the baseband signal to be fed back (the second signal; the in-phase component I*, the quadrature-phase component Q*) to determine whether or not the phase correction apparatuses functioning with the PLL lock. A configuration in the lock indicator 16 for the lock determination is not limited.

The lock indicator 16 may be constructed, for example, as follows. For example, when only the in-phase component is paid attention to, a normal value range for a difference value between I and I* (reference voltages at an upper limit and a lower limit) is previously set in the lock indicator 16. Then, the lock indicator 16 sequentially calculates the difference value between I and I* (voltage value) and compares the difference value with the reference voltages at the upper limit and the lower limit by using two comparators. Then, based on outputs (logical levels) of the two comparators, in a case where the difference value does not exceed the normal value range, it is determined that the lock is effected, and in a case where the difference value exceeds the normal value range, it is determined that the lock is not effected. The same applies to the quadrature-phase component.

As described above, the lock indicator 16 outputs the lock determination signal L_IND indicating whether or not the lock is effected to the π/2 phase shifter 18.

When this phase correction apparatus is regarded as the PLL, a loop filter of the PLL is equivalent to a filter characteristic of the phase detector 10. In view of the above, the difference value between I and I* calculated by the lock indicator 16 and the difference value between Q and Q* are preferably values taking into account the filter characteristic of the phase detector 10.

The π/2 phase shifter 18 is a phase shifter capable of performing a phase shift only at a rough amount, but the phase amount at which the shift may be performed is large. To be more specific, the π/2 phase shifter 18 shifts the phase of the baseband signal for transmission (first signal) based on the lock determination signal L_IND from the lock indicator 16 in the π/2 unit.

Herein, a shift processing on the in-phase component and the quadrature-phase component of the baseband signal to be input in the π/2 unit may be easily performed through inversion and/or replacement of the in-phase component and the quadrature-phase component. That is, when the in-phase component of the baseband signal input to the π/2 phase shifter 18 is set as X and the quadrature-phase component is set as Y, the in-phase component X* and the quadrature-phase component Y* of the signal whose phase of this input baseband signal is shifted by Δθ is as illustrated in the following Expression (6) and Expression (7). On the basis of Expression (6) and Expression (7), a phase shift result in the π/2 unit is as illustrated in Table 1. From Table 1, it is understood that the in-phase component X* and the quadrature-phase component Y* of the output baseband signal of the π/2 phase shifter 18 may be obtained through the inversion and/or replacement of the in-phase component X and the quadrature-phase component Y of the input baseband signal of the π/2 phase shifter 18.

$$X^* = X \cdot \cos(\Delta_\phi) - Y \cdot \sin(\Delta_\phi) \quad (6)$$

$$Y^* = X \cdot \sin(\Delta_\phi) + Y \cdot \cos(\Delta_\phi) \quad (7)$$

TABLE 1

|    | Δθ = 0 | Δθ = π/2 | Δθ = π | Δθ = 3π/2 |
|----|--------|----------|--------|-----------|
| X* | +X     | −Y       | −X     | +Y        |
| Y* | +Y     | +X       | −Y     | −X        |

Figure 5:
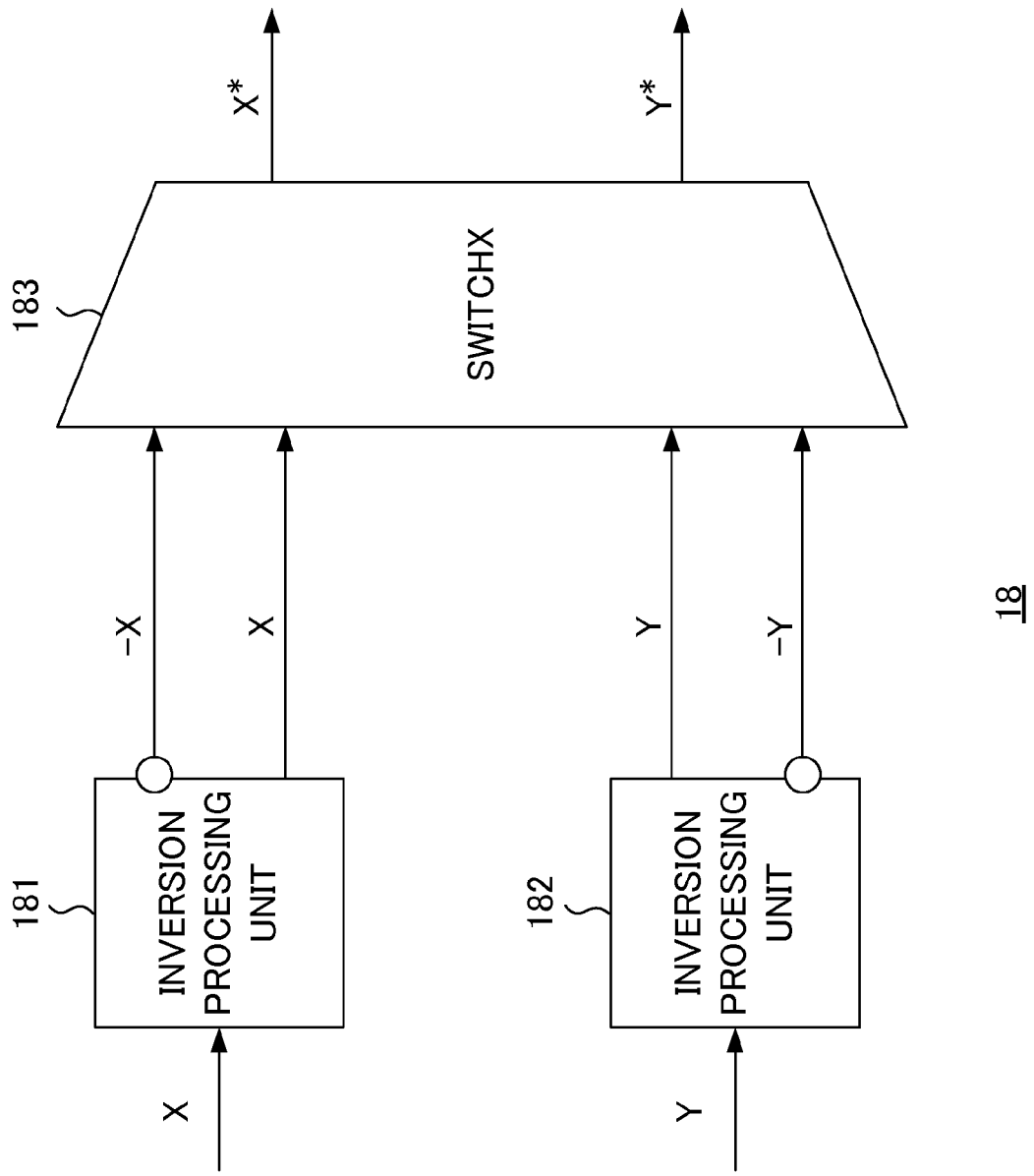
FIG. 5 is a block diagram illustrating a schematic configuration of a π/2 phase shifter according to the first embodiment.

In view of the above, the π/2 phase shifter 18 may adopt a simplified configuration illustrated in FIG. 5. FIG. 5 is a block diagram illustrating an example of a configuration of the π/2 phase shifter 18.

The π/2 phase shifter 18 exemplified in FIG. 5 is provided with inversion processing units 181 and 182 and a switch 183. The inversion processing unit 181 generates a signal −X which is obtained by inversing the in-phase component X of the baseband signal input to the π/2 phase shifter 18 and supplies the signals X and −X to the switch 183. The inversion processing unit 182 generates a signal −Y which is obtained by inversing the quadrature-phase component Y of the baseband signal input to the π/2 phase shifter 18 and supplies the signals Y and −Y to the switch 183.

The switch 183 is configured to select two signals of the input signals X, −X, Y, and −Y to be set as output signals X* and Y*. The signal selection in the switch 183 is performed while following Table 1 in accordance with a target phase shift amount (Δθ=0, π/2, π, or 3π/2).

(1-5) Operation of the Phase Correction

Next, mainly with reference to FIG. 3, an operation of the phase correction in the wireless transmitter according to the first embodiment will be described.

With reference to FIG. 3, in the wireless transmitter according to the first embodiment, the baseband signal for transmission (the in-phase component I, the quadrature-phase component Q) is modulated by the quadrature-phase modulator 40 and thereafter amplified to a desired level by the power amplifier 90 to be radiated to space. Herein, in order to compensate the linearity distortion in the power amplifier 90, the output signal RF_OUT of the power amplifier 90 is taken out by the directional coupler 93 and fed back as the RF signal y(t) (Cartesian feedback). The signal fed back to the quadrature-phase demodulator 30 is delayed because of the delay element of the feed back system as compared, for example, with the output signal of the quadrature-phase modulator 40. Therefore, the phase error may be generated between the baseband signal for transmission (the in-phase component I, the quadrature-phase component Q) and the baseband signal (the in-phase component I*, the quadrature-phase component Q*) obtained by the quadrature-phase demodulator 30. In order to compensate this phase error, the signals of the respective components are input to the phase detector 10. Also, the signals of the respective components of the baseband signal for transmission (the in-phase component I, the quadrature-phase component Q) and the baseband signal (the in-phase component I*, the quadrature-phase component Q*) are also input to the lock indicator 16.

On the basis of the signals of the respective components of the input baseband signal for transmission (the in-phase component I, the quadrature-phase component Q) and the baseband signal to be fed back (the in-phase component I*, the quadrature-phase component Q*), the phase detector 10 sets the controlled voltage CV (see FIG. 4) provided to the phase shifter 14 as the target correction amount. The controlled voltage CV is a value, for example, in accordance with sin(Δφ) when the phase error between the baseband signal for transmission and the baseband signal to be fed back is set as Δφ.

The phase shifter 14 performs the phase shift on the carrier signal sin(ωt) from the local oscillator 91 in accordance with a magnitude of the controlled voltage CV from the phase detector 10 and generates the carrier signal sin(ωt+Δφ) with respect to the quadrature-phase modulator 40. Herein, in a range where the phase error Δφ is small, for example, within the range of −π/2<Δφ<+π/2, the phase may be corrected by the phase shifter 14 alone, but in a case where the phase error Δφ is large, depending on the configurations of the phase detector 10 and/or the phase shifter 14, the phase may not be corrected by the phase shifter 14 alone.

In this phase correction apparatus, in a case where the phase is not corrected, it is determined by the lock indicator 16 that the lock is not effected, and the lock determination signal L_IND indicating that the lock is not effected is sent to the π/2 phase shifter 18. In the π/2 phase shifter 18 receiving the lock determination signal L_IND, the phase of the baseband signal for transmission (the in-phase component I, the quadrature-phase component Q) is shifted by π/2. Then, the lock indicator 16 determines again whether or not the lock is not effected (after elapse of a given period of time, for example, after the lock determination signal L_IND indicating that the lock is not effected is sent to the π/2 phase shifter 18). As a result, when it is determined that the lock is not yet effected, the lock indicator 16 sends the lock determination signal L_IND indicating that the lock is not effected to the π/2 phase shifter 18. Then, the π/2 phase shifter 18 further shifts the phase of the baseband signal for transmission (the in-phase component I, the quadrature-phase component Q) by π/2. In such a method, until it is determined by the lock indicator 16 that the lock is effected, the phase shift in the π/2 phase shifter 18 is carried out.

In an initial operation of the phase correction, even when it is determined by the lock indicator 16 that the lock is not effected, if the phase shift in the π/2 phase shifter 18 is carried out one time or is repeatedly carried out a plurality of times, eventually, the target correction amount (the phase error Δφ) is accommodated in the range (lock range) where the correction may be performed by the phase shifter 14 alone. In this way, the phase correction is almost completely carried out through the operations of the phase detector 10 and the phase shifter 14, and it is determined by the lock indicator 16 that the lock is effected.

As described above, the phase correction apparatus according to the first embodiment realizes the phase correction by using the phase shifter 14 which may perform the phase shift at a minute amount but whose phase amount at which the shift may be performed is small and the π/2 phase shifter 18 which may perform a phase shift only at a rough amount (according to the above-mentioned embodiment, the π/2 unit) but whose phase amount at which the shift may be performed is large in combination.

Herein, as illustrated in FIG. 3, the π/2 phase shifter 18 is arranged between the subtractor 38 and the quadrature-phase modulator 40. That is, in the feed back loop illustrated in FIG. 3, the π/2 phase shifter 18 is arranged on the direct line (direct line between the input and output of the system) instead of the feed back line. Herein, as already illustrated in Expression (5), while the transfer function arranged on the direct line is set as K(s), in the case of K(s)>>1 (for example, a case of dealing with a high frequency), the transfer function on the direct line may be ignored in the transfer function of the entire control system. This means that in the phase correction apparatus illustrated in FIG. 3, the characteristic of the output of the control system (that is, the output of the power amplifier) is resistant to the influence of the non-linearity of the π/2 phase shifter 18 and the distortion characteristic. Therefore, in the phase correction apparatus according to the first embodiment, the phase correction operation functions stably.

According to the first embodiment, the phase shift amount of the phase shifter provided to the direct line (according to the first embodiment, the π/2 phase shifter 18) is not limited to the π/2 unit. That is, in a case where the phase error may not be removed by the phase shifter 14, the phase shifter provided to the direct line may suffice as long as the phase shift on the baseband signal for transmission is complementarily carried out. The phase shift carried out in the π/2 unit is preferable in terms of promising simplification of the configuration (see FIG. 5), but the phase shift is not necessarily limited to be carried out in the π/2 unit. For example, similarly as in the phase shifter 14, the phase shifter provided to the direct line may suffice as long as the phase is shifted at an amount in accordance with the control voltage with respect to the baseband signal for transmission. Irrespective of the configuration of the phase shifter provided to the phase shifter 14 for the complementary purpose, as long as the complementary phase shifter is arranged on the direct line, the transfer function by the complementary phase shifter may be ignored in the transfer function of the entire control system.

Second Embodiment

Hereinafter, a wireless transmitter including another embodiment of the phase correction apparatus will be described. Herein, a configuration example of the phase detector 10 will be described according to the first embodiment.

(2-1) Digital Processing for the Phase Detection

In the phase correction apparatus according to the second embodiment, the phase detector 10 performs the phase detection through digital processing. A description will be given of a method for this digital processing with reference to FIG. 6.

FIG. 6 illustrates a relation between signs of the signals of the respective components in the baseband signal for transmission (the in-phase component I, the quadrature-phase component Q) and the baseband signal to be fed back (the in-phase component I*, the quadrature-phase component Q*) and signs of sin(Δφ) (Δφ: the phase error). The relation between them may be obtained through the above-mentioned Expression (3). In FIG. 6, a state in which the sign of sin(Δφ) is "indefinite" means that the sign of sin(Δφ) is not definite only based on the signs of I, Q, I*, and Q*. For example, in a case where all of I, Q, I*, and Q* are negative (−), the item (I·Q−I*·Q*) among the above-mentioned Expression (3) may be positive (+) or negative (−), and therefore in this case, the sign of sin(Δφ) is set as "indefinite".

As illustrated in FIG. 6, the phase detector 10 sequentially detects the signs of the respective components I, Q, I*, and Q*, and in a case where the sign of sin(Δφ) is positive (+), the phase detector 10 increases the value of the controlled voltage CV by a given amount. In a case where the sign of sin(Δφ) is negative (−), the phase detector 10 decreases the value of the controlled voltage CV by a given amount. In a case where the sign of sin(Δφ) is "indefinite", the phase detector 10 holds the value of the controlled voltage CV.

(2-2) Specific Configuration Example of the Phase Detector 10

Figure 7:
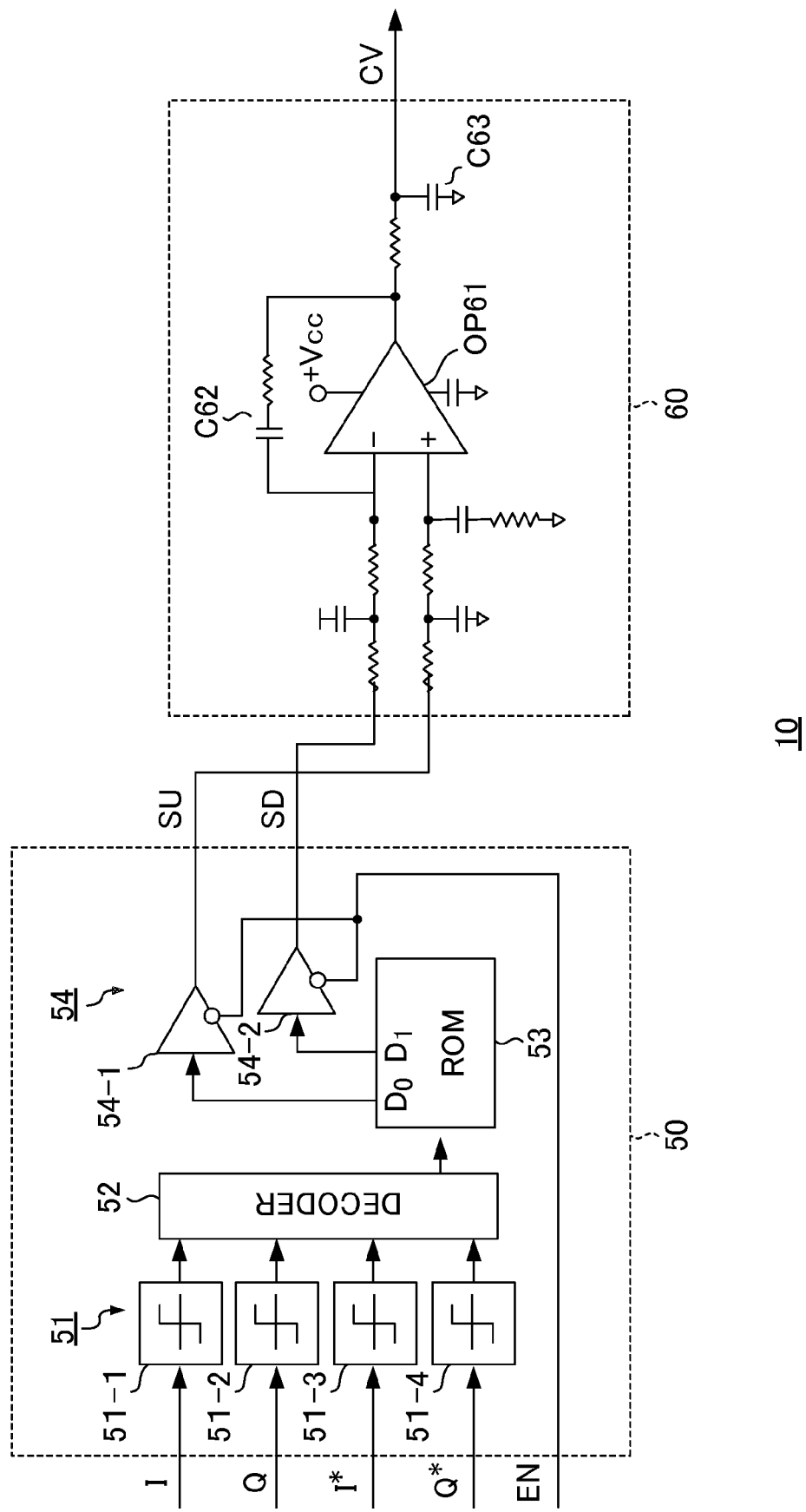
FIG. 7 is a block diagram illustrating a specific configuration of a phase detector according to the second embodiment.

Next, a specific configuration example of the phase detector 10 will be described with reference to FIGS. 7 to 9. FIG. 7 is a block diagram illustrating a specific configuration example of the phase detector 10. FIG. 8 illustrates a setting example of a ROM (Read Only Memory) in the phase detector 10 illustrated in FIG. 7. FIG. 9 illustrates an input and output relation of an integrator in the phase detector 10 according to the second embodiment.

The phase detector 10 illustrated in FIG. 7 includes a digital processing unit 50 and an integrator 60. The digital processing unit 50 is provided with a comparator group 51 (comparators 51-1 to 51-4), a decoder 52, a ROM 53 functioning as a first memory, and a buffer group (buffers 54-1 and 54-2). The integrator 60 is provided with an operation amplifier OP61 and a resistance element and capacitors (capacitors C62, C63, and the like) connected to an input terminal or an output terminal of the operation amplifier OP61.

In the digital processing unit 50, the respective comparators of the comparator group 51 binarize the input signals.

That is, the comparator 51-1 compares the signal level of the in-phase component I of the baseband signal for transmission (for example, a voltage amplitude level) with a given threshold. In a case where the signal level of I is larger than the threshold, the comparator 51-1 outputs "1" as the logical level. In a case where the signal level of I is equal to or smaller than the threshold, the comparator 51-1 outputs "0" as the logical level. The comparator 51-2 compares the signal level of the quadrature-phase component Q of the baseband signal for transmission with a given threshold. In a case where the signal level of Q is larger than the threshold, the comparator 51-2 outputs "1" as the logical level. In a case where the signal level of Q is equal to or smaller than the threshold, the comparator 51-2 outputs "0" as the logical level. The comparator 51-3 compares the signal level of the in-phase component I* of the baseband signal to be fed back with a given threshold. In a case where the signal level of I* is larger than the threshold, the comparator 51-3 outputs "1" as the logical level. In a case where the signal level of I* is equal to or smaller than the threshold, the comparator 51-3 outputs "0" as the logical level. The comparator 51-4 compares the quadrature-phase component Q* of the signal level of the baseband signal to be fed back with a given threshold. In a case where the signal level of Q* is larger than the threshold, the comparator 51-4 outputs "1" as the logical level. In a case where the signal level of Q* is equal to or smaller than the threshold, the comparator 51-4 outputs "0" as the logical level.

The threshold in the respective comparators is preferably 0 (zero). In a case where the threshold in the respective comparators is 0, the respective comparators are configured to output "1" (when the input signal is positive (+)) or "0" (when the input, signal is negative (−)) in accordance with the sign of the input signal. In this case, the relation between the comparator output and the sign of $\sin(\Delta\phi)$ illustrated in FIG. 8 is equivalent to the relation illustrated in FIG. 6.

However, the threshold in the respective comparators is not limited to 0 and may also take another value while taking into account the offset amount of the baseband signal or the like. In this case, the "signs" of the respective components illustrated in FIG. 6 may be grasped as a relative magnitude relation while a given threshold which is not limited to 0 is used as a reference. Even in a case where a threshold other than 0 is set, the threshold may be adopted as long as a determination as to whether the fluctuation in $\sin(\Delta\phi)$, that is, the controlled voltage CV is increased or decreased may be made based on the threshold.

The decoder 52 converts the outputs of the comparators 51-1 to 51-4 (4-bit parallel signals) into a value of an address of the ROM 53. With reference to FIG. 8, a relation between combinations of the outputs of the respective comparators ("0" or "1") and ROM addresses is defined. In the decoder 52, the ROM address is set while following this relation.

As illustrated in FIG. 8, the ROM 53 stores 2-bit data $D_0$, $D_1$ for each ROM address. The 2-bit data $D_0$, $D_1$ (logical level) in accordance with the ROM address set by the decoder 52 is output from the ROM 53.

The data of the ROM 53 is set in accordance with the following standard. That is, as illustrated in FIG. 8, in accordance with the outputs of the respective comparators, the following is determined that the value of the controlled voltage CV ($\sin(\Delta\phi)$) is increased, by a given amount, decreased by a given amount, or the value is held. Then, in a case where the sign of $\sin(\Delta\phi)$ is positive (+), $D_0=1$ and $D_1=0$ are set to be the output data of the ROM 53. In a case where the sign of $\sin(\Delta\phi)$ is negative (−), $D_0=0$ and $D_1=1$ are set to be the output data of the ROM 53. In a case where the sign of $\sin(\Delta\phi)$ is indefinite, $D_0=X$ and $D_1=X$ (both high impedance) are set.

The buffers 54-1 and 54-2 are respectively output buffers for outputting the data $D_0$, $D_1$ of the ROM 53 to the integrator 60. The respective buffers are controlled based on an external enable signal EN as to whether the data of the ROM 53 is output at the unchanged logical level or the output is set as high impedance. The respective buffers outputs the data $D_0$, $D_1$ as signals SU and SD to the integrator 60 when, for example, the enable signal EN is a low level. When the enable signal EN is a high level, the respective buffers set the data $D_0$, $D_1$, that is, the signals SU and SD as high impedance.

As illustrated in FIG. 7, in the integrator 60, the capacitor C62 is provided on a feed back loop for connecting an output terminal and an inversed input terminal of the operation amplifier OP61. The capacitor C62 and the resistance element connected to the input terminal of the operation amplifier OP61 form an integrator circuit. To the output terminal of the operation amplifier OP61, via the resistance element, the capacitor C63 for holding the controlled voltage CV is connected. In the integrator 60, as a polarity of an integration result is inverted with respect to the input signal, the respective signals SU and SD from the digital processing unit 50 are input to a non-inverted input terminal and the inverted input terminal of the operation amplifier OP61. In the case of an application of this phase correction apparatus to an actual system, with the resistance element and the capacitors in the integrator 60, the gain of the controlled voltage CV and the frequency characteristic may be adjusted.

With reference to FIG. 9, the integrator 60 operates in accordance with the values of the input signals SU and SD as follows. That is, in the integrator 60, when SU=1 ($D_0=1$) and SD=0 ($D_1=0$), the controlled voltage CV is increased by a given amount. In the integrator 60, when SU=0 ($D_0=0$) and SD=1 ($D_1=1$), the controlled voltage CV is decreased by a given amount. In the integrator 60, when the input is high impedance ($D_0=X$ and $D_1=X$), the value of the controlled voltage CV is held.

The operation of the phase detector 10 according to the second embodiment is as follows.

That is, in the phase detector 10, first, in the digital processing unit 50, the input signals of the respective components (I, Q, I*, and Q*) are compared with the given threshold and then binarized (digitalized). The data as to whether or not the value of $\sin(\Delta\phi)$, when the phase error is set as $\Delta\phi$, is to be increased, decreased, or held based on the combinations of the binarized signals of the respective components is previously stored in the ROM 53 in the digital processing unit 50 (see FIG. 6). In the digital processing unit 50, the signals of the respective components (I, Q, I*, and Q*) are sequentially taken in, and 2-bit data ($D_0$, $D_1$) is taken out from the corresponding ROM 53. This ROM data is supplied to the integrator 60 via the buffer as a signal at a given amplitude level (signal at the same logical level as that of the ROM data). In the integrator 60, based on the signal from the buffer, the output voltage with respect to the phase shifter 14 (the controlled voltage CV) is increased, decreased, or held (which is sequentially updated). In this manner, the controlled voltage CV in accordance with the value of $\sin(\Delta\phi)$ when the phase error is set as $\Delta\phi$ is provided to the phase shifter 14.

With the phase correction apparatus and the phase correction method according to the first and second embodiments thus disclosed, the stability of the phase correction operation is improved.

For example, in the distortion compensation apparatus according to the first and second embodiments, the example has been illustrated in which the phase detector 10 shifts the phase of the carrier signal (the first carrier signal) provided to the quadrature-phase modulator 40, but the target of the phase shift is not limited to the above. The target of the phase shift by the phase detector 10 may also be the baseband signal for transmission, the baseband signal to be fed back, or the carrier signal (the second carrier signal) provided to the quadrature-phase demodulator 30.

Also, the specific circuit configuration which is referred to for describing the second embodiment is a mere example for the description of the second embodiment, and another circuit structure provided with a similar function may of course be used instead. For example, the integrator illustrated in FIG. 7 is a mere example, and the same function may also be realized by a digital circuit. In this case, the digital circuit may be provided with a counter for performing addition or subtraction in accordance with the signal level from the digital processing unit 50, a DAC (Digital/Analogue Converter), and the like. The integrator illustrated in FIG. 7 adds or subtracts the signal output from the digital processing unit (logical level voltage) at an analog level, and the integrator is economically superior as the provision of the DAC may not be necessary.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustration of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A phase correction apparatus in a wireless transmitter for converting a first signal into a wireless signal and amplifying the wireless signal by a power amplifier, the phase correction apparatus comprising:
   a quadrature-phase modulator for modulating an in-phase component and a quadrature-phase component of the first signal by a first carrier signal;
   a quadrature-phase demodulator for demodulating a returned signal returned from an output of the power amplifier by a second carrier signal and generating a second signal including an in-phase component and an quadrature-phase component;
   a phase detector for detecting a phase error between the first signal and the second signal based on the in-phase components and the quadrature-phase components of the first signal and the second signal; and
   a phase shifter group for performing a phase shift based on the phase error, the phase shifter group including a first phase shifter for performing a phase shift on any of the first signal, the second signal, the first carrier signal, and the second carrier signal and a second phase shifter for shifting a phase of the first signal.

2. The phase correction apparatus according to claim 1, wherein the second phase shifter shifts the phase of the first signal in a $\pi/2$ unit.

3. The phase correction apparatus according to claim 2, further comprising:
   a correction determination unit for determining whether or not the phase error is corrected based on the in-phase components and the quadrature-phase components of the first signal and the second signal,
   wherein the correction determination unit controls the second phase shifter so as to sequentially shift the phase of the first signal in the $\pi/2$ unit each time when determined that the phase error is not corrected.

4. The phase correction apparatus according to claim 1, wherein the phase detector includes a first memory storing information as to whether a sine value of the phase error is to be increased, decreased, or held in accordance with a combination of binarized signals of the respective components of the first signal and the second signal and refers to the first memory based on sequentially binarized respective components of the first signal and the second signal to sequentially update the sine value of the phase error.

5. The phase correction apparatus according to claim 1, wherein the first phase shifter shifts a phase in a given first range with respect to a signal of a phase shift target, and wherein the second phase shifter shifts a phase exceeding the first range with respect to the first signal.

6. A phase correction method in a wireless transmitter for converting a first signal into a wireless signal and amplifying the wireless signal by a power amplifier, the phase correction method comprising:
   modulating an in-phase component and a quadrature-phase component of the first signal by a first carrier signal;
   demodulating a returned signal returned from an output of the power amplifier by a second carrier signal and generating a second signal including an in-phase component and an quadrature-phase component;
   detecting a phase error between the first signal and the second signal based on the in-phase components and the quadrature-phase components of the first signal and the second signal; and
   performing a phase shift based on the phase error on any of the first signal, the second signal, the first carrier signal, and the second carrier signal, and shifting a phase of the first signal in a given unit.

7. The phase correction method according to claim 6, wherein
   the shifting includes shifting the phase of the first signal in a $\pi/2$ unit.

8. The phase correction method according to claim 6, further comprising:
   determining whether or not the phase error is corrected based on the in-phase components and the quadrature-phase components of the first signal and the second signal; and
   sequentially shifting the phase of the first signal in the $\pi/2$ unit each time it is determined that the phase error is not corrected.

9. The phase correction method according to claim 6, wherein
   the detecting includes storing information as to whether a sine value of the phase error is to be increased, decreased, or held in accordance with a combination of binarized signals of the respective components of the first signal and the second signal and refers to the information based on sequentially binarized respective components of the first signal and the second signal to sequentially update the sine value of the phase error.

10. The phase correction method according to claim 6, wherein
    the performing the phase shift includes shifting a phase in a given first range with respect to a signal of a phase shift target, and
    the shifting includes shifting a phase exceeding the first range with respect to the first signal.

* * * * *